United States Patent [19]

Weitze et al.

[11] 4,047,290
[45] Sept. 13, 1977

[54] PROCESS FOR THE PRODUCTION OF A MULTI-CHIP WIRING ARRANGEMENT

[75] Inventors: Artur Weitze; Michail Sapunarow, both of Munich, Germany

[73] Assignee: Siemens Aktiengesellschaft, Berlin & Munich, Germany

[21] Appl. No.: 609,687

[22] Filed: Sept. 2, 1975

[30] Foreign Application Priority Data

Sept. 10, 1974  Germany .............................. 2443287

[51] Int. Cl.² .......................... H05K 3/06; H05K 3/10
[52] U.S. Cl. ........................................ 29/625; 29/628; 174/68.5; 427/96; 427/97
[58] Field of Search ................. 29/625, 624, 626, 577; 427/96, 97, 98, 99, 123, 124, 125, 126, 127; 204/15, 20, 38 R, 40, 41; 174/68.5; 317/101 B, 101 C

[56] References Cited

U.S. PATENT DOCUMENTS

| | | | |
|---|---|---|---|
| 3,619,725 | 11/1971 | Soden et al. | 427/96 X |
| 3,672,986 | 6/1972 | Schneble et al. | 427/98 X |
| 3,756,891 | 9/1973 | Ryan | 29/625 X |
| 3,773,554 | 11/1973 | Scrutton et al. | 427/126 |
| 3,808,046 | 4/1974 | Davey | 427/96 |
| 3,808,049 | 4/1974 | Caley et al. | 427/96 |
| 3,808,681 | 5/1974 | Law et al. | 29/628 |
| 3,934,336 | 1/1976 | Morse | 29/627 |

OTHER PUBLICATIONS

"Solid State Technology," Multilayer Substrates Utilizing Thin Film and Thick Film Technologies, May 1971, pp. 38-42.

Primary Examiner—Victor A. DiPalma
Attorney, Agent, or Firm—Hill, Gross, Simpson, Van Santen, Steadman, Chiara & Simpson

[57] ABSTRACT

A process for producing multi-chip wiring arrangements which consist of a ceramic carrier with through contact holes associated with thin film wiring on one side of the carrier and with multi layer, thick layer wiring on the other side of the carrier. The holes on the one side of the carrier are metallized and galvanically strengthened while the holes on the other side of the carrier are sealed by baking therein a thick layer of paste. Thereafter the multi layer, thick layer wiring and the thin film wiring are produced in that order.

6 Claims, 10 Drawing Figures

PROCESS FOR THE PRODUCTION OF A MULTI-CHIP WIRING ARRANGEMENT

BACKGROUND OF THE INVENTION

1. Field of the Invention

The field of art to which this invention pertains is methods for producing multi-chip wiring arrangements which include a ceramic carrier and through contact holes and have thin film wiring and multi layer thick layer wiring on opposite sides of the carrier.

2. Description of the Prior Art

A type of process is known from "Solid State Technology" May 1971, Pages 38 to 42, in which a ceramic carrier previously drilled with the aid of laser beams is initially provided on one side with multi-layer, thick-layer wiring. Then, the opposite side of the ceramic carrier is metallized and the thin-film wiring with connection surfaces for semiconductor modules is produced by photo-etching. In the last process step through-contacts are produced, in that the walls of the bores are firstly metallized without current and are then galvanically strengthened. The bores in the ceramic substrate must be continued through the whole of the thick-layer wiring so that they can be subsequently metallized for the production of the through-contacts. At the desired packing density this results in an area loss of approximately 30 to 40%. Also the raster of the thick-layer wiring is disturbed by the bores to such an extent that occasionally a number of layers are required which simply cannot be produced with an adequate yield with prior art thick-layer techniques.

SUMMARY OF THE INVENTION

It is an important feature of the present invention to provide an improved method for producing a multi-chip wiring arrangement.

It is another feature of the present invention to provide a method for producing a multi chip-wiring arrangement which utilizes thin film wiring on one side and a multi layer thick layer wiring on the other side of the ceramic carrier.

It is a principle object of the present invention to provide a multi-chip wiring arrangement as described above wherein method steps are used to assure a maximum packing density and a high yield.

It is an additional object of the present invention to provide a multi-chip wiring arrangement as described above wherein the through contact holes are metallized and galvanically strengthened and the holes on the other side of the carrier are sealed by baking a thick layer paste.

These and other objects, features and advantages of the present invention will be understood in greater detail from the following description and the associated drawings wherein reference numerals are utilized to designate a preferred embodiment.

DESCRIPTION OF THE PREFERRED EMBODIMENT

Figure 1:
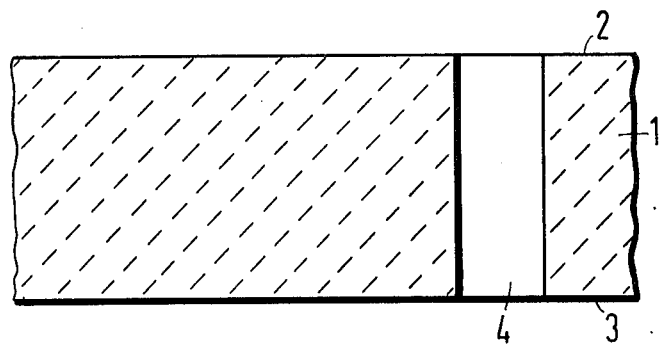
FIG. 1 shows a ceramic carrier with a hole drilled therethrough which is used in the present invention.

This invention relates to a process for producing a multichip wiring arrangement which consists of a ceramic carrier with through-contact holes associated with thin-film wiring on one side of the ceramic carrier and with multi-layer, thick-layer, wiring on the other side wherein the holes are initially introduced into the ceramic carrier.

Therefore it is an object of the invention to improve upon known processes in such manner that it is possible to produce multichip wiring arrangements with an extremely high packing density and high yield.

In accordance with the invention, this object is realized by a novel process namely, the walls and edge zones of the holes on one side of the ceramic carrier are metallized and galvanically strengthened; the holes on the other side are sealed off by baking in a thick-layer paste, and the multi-layer, thick-layer wiring and the thin-film wiring are then produced consecutively.

The advantage of the process in accordance with the invention consists, in particular, that the through-contacts which are the first to be produced and which are then sealed on one side do not occupy any of the wiring surface, so that a multi-layer, thick-layer wiring can be constructed by exploiting the maximum possible packing density. Further savings of space are achieved by the resultant simple raster formation of the multi-layer, thick-layer wiring which considerably simplifies the layout. A further advantage is achieved in that the sensitive thin-film wiring and its connection faces for semiconductor modules is not produced until the last process step. This avoids damage in the course of further process steps, i.e. a considerable simplification of the micro-preparative work is achieved and a higher yield is ensured.

Preferably, for the metallization of the walls and of the edge zones of the holes, an adhesive layer and above it, a contacting layer are vapor-deposited or atomized onto both sides of the ceramic carrier and onto the walls of the holes, the contacting layer is galvanically strengthened in the region of the walls and the edge zones of the holes, and then the non-strengthened zones of the adhesive layer and of the contacting layer are etched away. Advantageously, here the adhesive layer is formed from titanium, the contacting layer is formed from gold and the galvanic reinforcement is likewise composed of gold. Due to the fact that the adhesive layer and the contacting layer are vapor-deposited or atomized, a considerably better adhesion of the metallization is achieved in the through-contacted holes than with layers deposited in currentless fashion.

A preferred exemplary embodiment of the process in accordance with the invention has a base layer and above it a contacting layer which are vapor-deposited or atomized onto one side of the ceramic carrier, the thin-film wiring structure is formed by galvanic deposition of a conductive layer, an intermediate layer and a solder-rejecting layer, wherein all the connection surfaces are covered in the deposition of the solder-rejecting layer. The exposed zones of the base layer and of the contacting layer are etched away, and then the connection surfaces are covered with a solderable contact layer by selective currentless metal deposition.

Advantageously, here the base layer is composed of titanium, the contacting layer is composed of copper, the conductive layer is composed of copper, the intermediate layer is composed of nickel, the solder-rejecting layer is composed of chrome and the conductive contact layer is composed of gold. The thin-film wiring produced in this way thus possesses conductor paths with a solder-rejecting layer on the surface and connection surfaces with a solderable contact layer on the surface. It is thus possible to selectively coat the connection surfaces with solder in a surge- or dip-bath, without any danger of short-circuit due to the formation of solder bridges between the conductor paths.

The connection surfaces are formed with reproducible dimensions so that cup-shaped solder coatings of equal height are formed upon them in the surge- or dip-bath. This ensures a safe and reliable flip-chip-contacting of the semiconductor or modules which are to be soldered into position. The intermediate layer has the function of a diffusion barrier and thus results in increased reliability in continuous operation.

In the following, an exemplary embodiment of the process in accordance with the invention will be explained in detail making reference to the drawing. All the figures represent sectional diagrams.

FIG. 1 shows a ceramic carrier 1 on the upper side 2 of which a thin-film wiring is to be produced and on the lower side 3 of which a thick-layer wiring is to be produced. Firstly, holes 4 are introduced into this ceramic carrier 1 at the points provided for through-contacts. The holes 4, which have a diameter of approximately 200/um are formed by laser beams.

Figure 2:
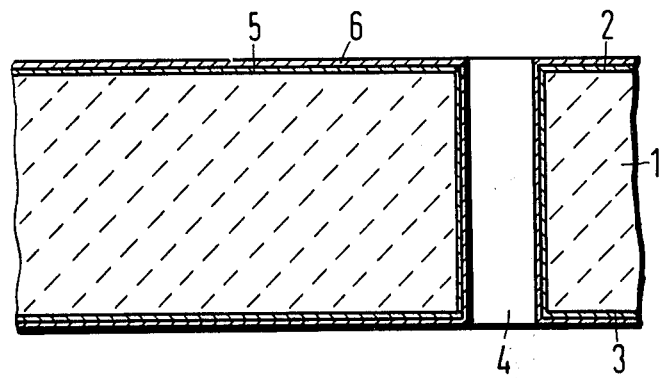
FIG. 2 shows the carrier following the vapor deposition of an adhesive layer and a contacting layer of gold.

FIG. 2 shows the ceramic carrier 1 following the vapor-deposition of an approximately 70 nm thick adhesive layer 5 consisting of titanium, and of an overlying approximately 0.2/um thick contacting layer 6 of gold. The vapor-deposition is in each case carried out by oblique vapor-deposition in vacuum onto both sides of the ceramic carrier 1 which is set in rotation. It is thus possible to apply the adhesive layer 5 and the contacting layer 6 to the upper side 2, the lower side 3, and the walls of the holes 4.

Figure 3:
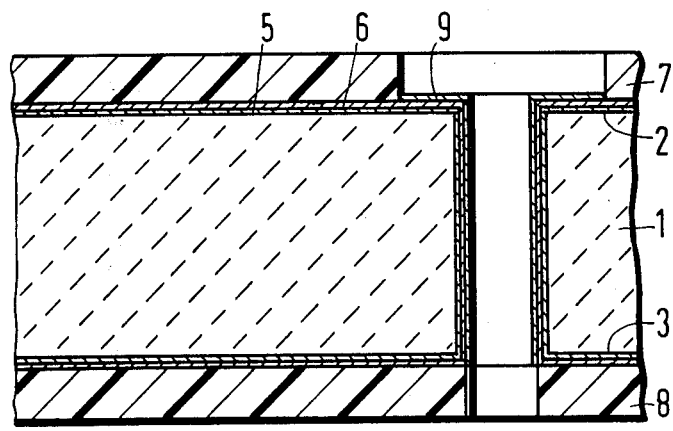
FIG. 3 shows the arrangement of FIG. 2 with photo-resist layers applied thereto.

In accordance with FIG. 3, photo-resist layers 7 and 8 which do not cover the holes 4 are applied to the upper side 2 and the lower side 3 of the ceramic carrier 1. In the region of the edge zones of the holes 4, the photo-resist layer 7 is again removed. For this purpose, firstly an appropriate contact mask is applied; the edge zones are exposed and then developed so that uncovered square edge zones having side length of approximately 300/um are formed around the holes 4. Then an approximately 10/um thick gold layer 9 is applied to these edge zones and to the walls of the holes 4. The gold layer 9 is applied galvanically in the gold bath, where the contacting layer 6 is connected as a cathode.

Figure 4:
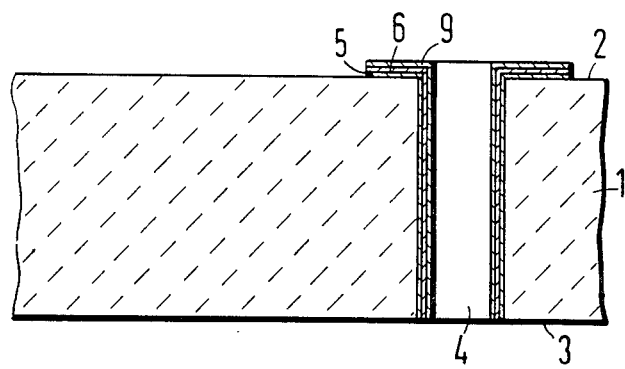
FIG. 4 shows the carrier 1 after the photo-resist layers have been removed and after the etching away of given regions of the layers 5 and 6.

FIG. 4 shows the ceramic carrier 1 after the removal of the photo-resist layer 7 and 8, and after the etching away of the non-galvanically-strengthened regions of the adhesive layer 5 and of the contacting layer 6. The etching is effected by dipping the ceramic carrier 1 into two different etching solutions.

Figure 5:
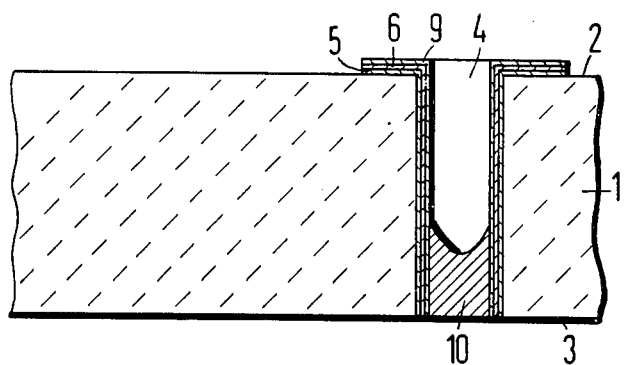
FIG. 5 shows a subsequent step of the invention, wherein the holes are sealed at the lower side of the carrier with a gold-thick-layer paste.

In accordance with FIG. 5, the holes 4 on the lower side 3 of the ceramic carrier 1 are then sealed with a gold thick-layer paste 10. The gold thick-layer paste is for example in the form of gold paste composition 8780 of the Du Pont Company, Wilmington, Del. or the gold paste composition 8810 of the Electo-Science Laboratories of Pensauken, N.J. The filling of the gold thick-layer paste 10 into the holes 4 is effected by pressure with an appropriate silk-screen printing template. Then the gold thick-layer paste 10 is baked in a furnace whose temperature does not exceed 1000° C.

Figure 6:
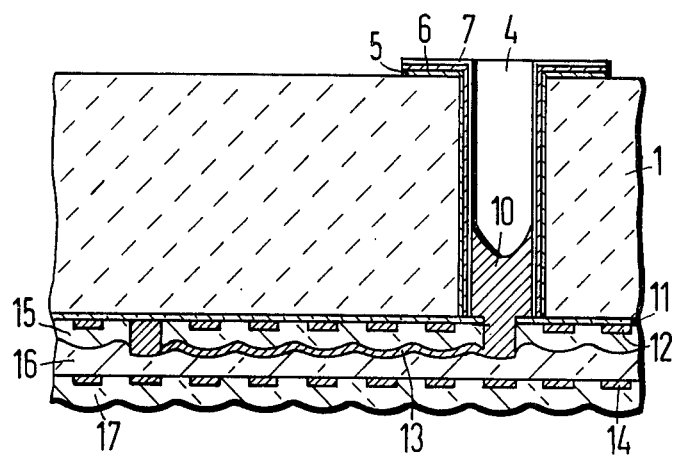
FIG. 6 shows the carrier after a thick layer circuit has been produced on its lower side.

FIG. 6 shows the ceramic carrier 1 after the production of a thick-layer circuit on its lower side 3. For this purpose firstly a silk-screen printed insulating layer 11 is applied to the lower side 3, which layer 11 leaves exposed the through-contact windows which are of square formation and have a side length of approximately 150/um at the holes 4 closed on one side. Then in a known manner, a multilayer, thick-layer wiring is produced on the silk-screen printed insulating layer 11. Alternately, conductor path layers 12, 13 and 14 and insulating layers 15, 16 and 17 are pressed one over another and are baked. If the subsequent wiring of the multi-chip wiring is carried out via the thick-layer wiring after the baking process, metal pins can be soldered thereto which establish the requisite connection to an external wiring. However, it is also possible to carry out the subsequent wiring via corresponding outer terminals of the thin-film wiring.

Figure 7:
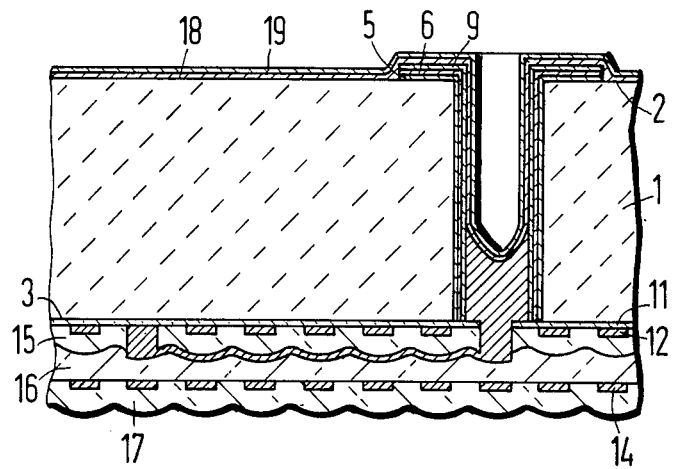
FIG. 7 shows the carrier with a base layer of titanium on the upper surface and a contacting layer of copper above the titanium layer.

In accordance with FIG. 7, then an approximately 0.05/um thick base layer 18 consisting of titanium is vapor-deposited onto the upper side 2 of the ceramic carrier 1, and an approximately 0.05/um thick contacting layer 19 consisting of copper is vapor-deposited above said base layer. The vapor-deposition is again carried out by oblique vaporization in a vacuum with a rotating ceramic carrier 1, so that the base layer 18 and the contacting layer 19 are also applied to the walls of the holes 4. The use of the adhesive layer 5 and the contacting layer 6 instead of the base layer 18 and the contacting layer 19 is not possible since both layers diffuse into one another during the baking-in of the gold thick-layer paste 10, and thereafter can no longer be etched away.

Figure 8:
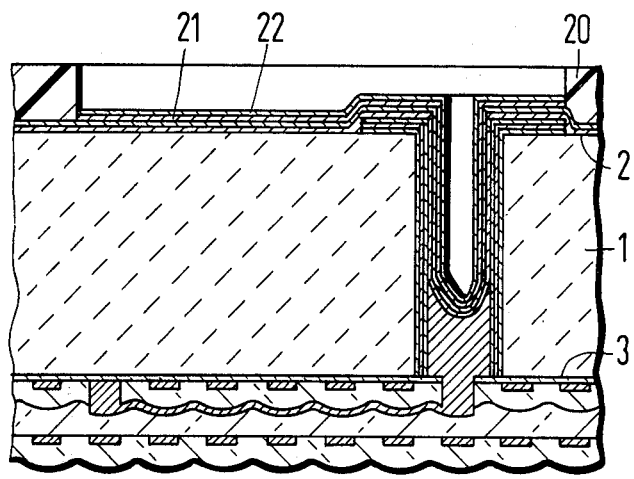
FIG. 8 shows the device described above with a photo-lacquer layer 20 applied to the upper side of the carrier.

As illustrated in FIG. 8, then a photo-lacquer layer 20 is applied to the upper side 2 of the ceramic carrier 1 and is exposed by an appropriate contact mask and then developed so that a negative image of the thin-film wiring structure is formed. Then an approximately 10/um thick conductive layer 21 of copper and above the latter an approximately 3/um thick intermediate layer 22 of nickel are galvanically deposited onto those zones which are not covered by the photo-lacquer layer 20. During the deposition in the copper and nickel baths the contacting layer 19 is in each case connected as a cathode.

Figure 9:
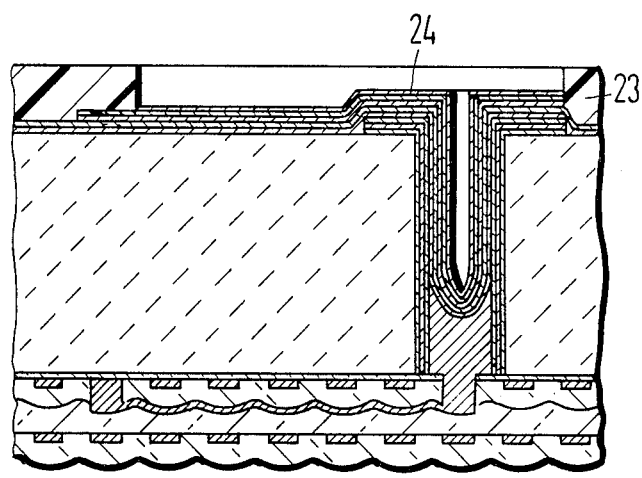
FIG. 9 shows the device with the photo-lacquer layer removed and an additional photo-lacquer layer applied as will be described in detail below.

After the removal of the photo-lacquer layer 20, in accordance with FIG. 9, a photo-lacquer layer 23 is applied to the upper side 2 of the ceramic carrier 1. This photo-lacquer layer 23 is exposed via a corresponding contact mask and developed, so that none of the thin-film wiring structure is covered except for the later connection surfaces. The zones of the later connection surfaces which are covered in addition to the photo-lacquer layer 20 are circular with a diameter of approximately 150/um. Then an approximately 0.5/um thick solder-rejecting layer 24 of chrome is galvanically deposited onto the remaining parts of the thin-film wiring structure.

Figure 10:
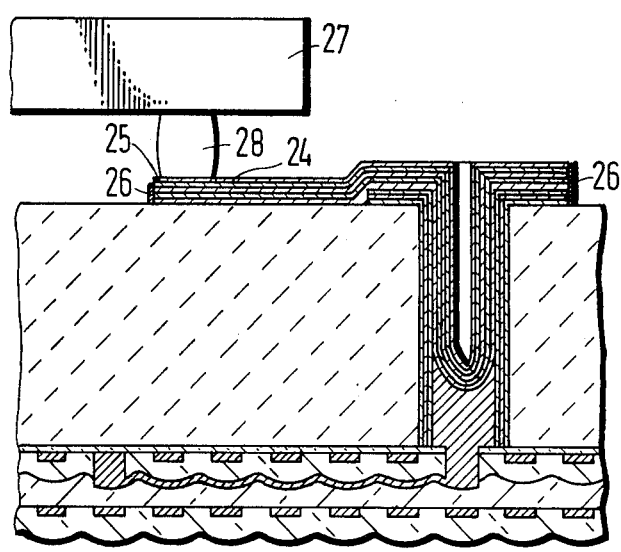
FIG. 10 shows the final form of the multi-chip wiring arrangement.

In accordance with FIG. 10, the photo-lacquer layer 23 is removed and, in the regions which do not correspond to the thin-film wiring structure, the base layer 18 and the contacting layer 19 are removed by dipping in two different etching solutions. Those faces of the connection surfaces which are not chrome plated as well as the flanks of the thin-film wiring structure, are coated with an approximately 0.2/um thick contact layer 25, and a corrosion-protection layer 26 of gold. The selective application of the contact layer 25 and the corrosion-protection layer 26 is carried out in a currentless gold bath operating by the ion-exchange principle. The contact layers 25 of the connection surfaces are then coated with a solder coating be being dipped into a solder bath. The chrome-plated wiring surfaces and through-contact walls do not receive any solder. The solder coating produced in this way is of cup-shape and possesses a height of 28 to 32/um. With this low height-tolerance of the solder layers, the soldering of semiconductor modules such as 27, presents no difficulties and reliable flip-chip connections 28 are formed.

We claim as our invention:

1. A method for producing a multi-chip wiring arrangement on a carrier comprising the steps of:
   forming through holes in the carrier,
   metallizing and galvanically strengthening the walls and edge zones of the holes on one side of the carrier,
   filling the holes on the other side of the carrier with a conductive paste,
   baking the conductive paste in the holes and thereby sealing the same,
   forming multi-thick layer wiring on the other side of the carrier and
   forming thin film wiring on said one side of the carrier.

2. A method in accordance with claim 1 wherein the carrier is a ceramic carrier and wherein the holes at said other side thereof are filled with a thick layer gold paste.

3. A method in accordance with claim 1 wherein the metallizing and galvanically strengthening of the walls and edge zones of the holes includes the steps of:
   forming an adhesive layer on the carrier and into said holes,
   forming a contacting layer on the carrier and into said holes,
   galvanically reinforcing said contacting layer in the region of the walls and edge zones of the holes, and
   etching away those areas of the adhesive and contacting layer which are not galvanically reinforced.

4. A method in accordance with claim 3 wherein the adhesive layer is formed from titanium and the contacting layer and the galvanic reinforcement consist of gold layers.

5. A method in accordance with claim 1 the forming of the thin film wiring includes the steps of:
   depositing a base layer on the carrier,
   depositing a contacting layer on said base layer,
   galvanically depositing a conductive layer onto the contacting layer; an intermediate layer onto said conductive layer; and a solder-rejecting layer on areas of the conductive layer excluding the connection surfaces,
   etching away exposed areas of the base layer and contacting layer, and
   covering the connection surfaces with a solderable contact layer by selective currentless metal deposition.

6. A method in accordance with claim 5 wherein the base layer is titanium, the contact layer is copper, the conductive layer is copper, the intermediate layer is nickel, the solder-rejecting layer is chrome and the solderable contact layer is gold.

* * * * *